United States Patent [19]
Ashizawa et al.

[11] Patent Number: 5,654,604
[45] Date of Patent: Aug. 5, 1997

[54] VIBRATION MOTOR HAVING IMPROVED ADHESIVE LAYER BETWEEN ELECTROMECHANICAL CONVERSION ELEMENT AND ELASTIC BODY

[75] Inventors: Takatoshi Ashizawa, Kawasaki; Daisuke Saya, Urayasu; Ryoichi Suganuma, Yokohama; Tomohiko Yokoo, Inagi, all of Japan

[73] Assignee: Nikon Corporation, Tokyo, Japan

[21] Appl. No.: 614,908

[22] Filed: Mar. 13, 1996

Related U.S. Application Data

[63] Continuation of Ser. No. 401,302, Mar. 9, 1995, abandoned, which is a continuation of Ser. No. 190,557, Feb. 2, 1994, abandoned.

[30] Foreign Application Priority Data

| Feb. 2, 1993 | [JP] | Japan | 5-039363 |
| Feb. 2, 1993 | [JP] | Japan | 5-039364 |
| Feb. 2, 1993 | [JP] | Japan | 5-039365 |
| Aug. 31, 1993 | [JP] | Japan | 5-238736 |

[51] Int. Cl.$^6$ ................................ H01L 41/08
[52] U.S. Cl. ............................ 310/323; 310/346
[58] Field of Search ............................ 310/323, 328, 310/346

[56] References Cited

U.S. PATENT DOCUMENTS

| 3,441,754 | 4/1969 | Heny | 310/346 |
| 4,978,882 | 12/1990 | Kitani | 310/328 |
| 5,012,151 | 4/1991 | Eer Nisse et al. | 310/346 |
| 5,034,646 | 7/1991 | Shirasaki | 310/323 |
| 5,066,884 | 11/1991 | Takagi et al. | 310/323 |
| 5,099,166 | 3/1992 | Hirano et al. | 310/323 |
| 5,134,334 | 7/1992 | Ohnishi et al. | 310/323 |

FOREIGN PATENT DOCUMENTS

| 0194581 | 8/1988 | Japan | 310/323 |
| 0030473 | 2/1989 | Japan | 310/323 |
| 0231970 | 9/1990 | Japan | 310/323 |
| 0273083 | 11/1990 | Japan | 310/323 |
| 0198674 | 8/1991 | Japan | 310/323 |
| 3-203576 | 9/1991 | Japan . | |
| 3-284173 | 12/1991 | Japan | 310/323 |

*Primary Examiner*—Mark O. Budd

[57] ABSTRACT

An ultrasonic motor having an electromechanical element and an elastic body joined by an adhesive layer, wherein the adhesive layer is chosen for having either a specific thermal expansion coefficient, a specific shrinkage volume, a high Vickers hardness, a high longitudinal elastic modulus, or a high Vickers hardness and a high longitudinal elastic modulus. By proper selection of an adhesive for use in the adhesive layer, the motor drive efficiency, starting torque and power consumption can be improved by reducing the deformation of the elastic body and maintaining a larger contact area with a contact member or movable element. Proper selection of an adhesive also allows the motor's performance level to be maintained when the temperature changes.

13 Claims, 4 Drawing Sheets

RELATIONSHIP OF POWER CONSUMPTION TO LONGITUDINAL HARDNESS

VIBRATION MOTOR HAVING IMPROVED ADHESIVE LAYER BETWEEN ELECTROMECHANICAL CONVERSION ELEMENT AND ELASTIC BODY

This application is a continuation of application Ser. No. 08/401,302, filed Mar. 9, 1995, now abandoned, which is a continuation of application Ser. No. 08/190,557, filed Feb. 2, 1994, now abandoned.

BACKGROUND OF THE INVENTION

1. Field of the Invention

This invention relates to ultrasonic motors and, more particularly, to ultrasonic motors having an improved adhesive layer between an electromechanical conversion element and an elastic body.

2. Description of the Related Art

A traveling wave ultrasonic motor is disclosed in JP-B-1-17354 (Japanese Examined Patent Publication 1-17354) which utilizes the expansion and contraction of an electromechanical conversion element, such as a piezoelectric body, to convert electrical energy into mechanical motion. A traveling wave is generated in the drive surface of an elastic body and a moving body in pressure contact with this drive surface is driven by the traveling wave.

In the device of JP-B-1-17354, the elastic body is integrally joined to the piezoelectric body and the elastic body is excited by the vibration of the piezoelectric body.

The method of joining the elastic body and the piezoelectric body is a weld deposition or an adhesive method. In many instances, the piezoelectric body Curie point is generally 350° C. or less since exposure to a high temperature state is not possible in practice.

However, use of an adhesion layer to join the elastic body and the piezoelectric body can cause unwanted attenuation of the vibration of the elastic body. This attenuation of the vibration of the elastic body can be reduced by providing a relatively thin adhesive layer, as described in Nikei Mechanical, December 1990, Extra Issue, "Motor Applications."

However, as recognized by the present invention, the adhesive layer joining the elastic body and the piezoelectric body is not simply a structural junction at a surface; it also serves as a functional junction to propagate vibration. Therefore, the present invention recognizes that, when the adhesive layer is made relatively thin, the properties of the adhesive layer cause an attenuation of the vibration of the piezoelectric layer. This results in an insufficient starting torque of the ultrasonic motor. In addition, the power consumption is increased, the drive efficiency is reduced and the performance of the ultrasonic motor falls off.

Additionally, the elastic body and piezoelectric body differ greatly in thermal expansion coefficients due to the nature of the different material characteristics. The differing amounts of expansion due to temperature changes causes a deformation of the motor stator. In order to prevent this phenomenon, an elastic body and an electrostrictive element of about the same thermal expansion coefficient was proposed in JP-A-60-62883 (Japanese Laid-Open Patent Publication 60-62883).

However, while the thermal expansion coefficients of the elastic body and the piezoelectric body may be the same in the device as described in JP-A-60-62883, the present invention recognizes that this method of reducing the effect of temperature changes does not consider that an adhesive layer exists between the elastic body and the piezoelectric body. The thermal expansion coefficient of the adhesive layer can typically be one to two orders of magnitude greater than the thermal expansion coefficient of a metal or piezoelectric body.

Also, because the adhesive layer used to join the elastic body and piezoelectric body has an additional function of reliably transmitting the vibration of the piezoelectric body to the elastic body, the present invention recognizes that it is preferable to use an adhesive which is comparatively hard after setting. Moreover, there are many adhesives which set by chemical reaction and generally shrink after setting. In the event that such an adhesive shrinks, the present invention recognizes that material which is adhered is pulled in the direction of shrinkage. As a result of a shrinking adhesive which has become relatively hard after setting, the adhesive absorbs tensile stress of the adhered material and the adhered material becomes deformed.

SUMMARY OF THE INVENTION

Accordingly, it is an object of the present invention to provide an ultrasonic motor with sufficient starting torque, reduced power consumption and increased drive efficiency.

It is a further object to provide an ultrasonic motor with a reduced deformation of the elastic body occurring as a result of temperature changes.

It is also an object to provide an ultrasonic motor wherein, when the temperature changes, changes in the starting torque, power consumption and drive efficiency of the movable element can be decreased while motor performance remains the same.

It is also object of the present invention to provide an ultrasonic motor with an adhesive for use in joining a piezoelectric body and a elastic body, wherein the adhesive is properly selected to achieve the above objectives.

It is a still further object of the present invention to select an adhesive for an adhesive layer based on the Vickers hardness, the longitudinal elastic modulus, the thermal expansion coefficient or the shrinkage effect of the adhesive.

Additional objects and advantages of the invention will be set forth in part in the description which follows, and, in part, will be obvious from the description, or may be learned by practice of the invention.

The foregoing objects of the present invention are achieved by providing an ultrasonic motor comprising an electromechanical conversion element which can be excited by a drive signal, an elastic body having a drive surface and joined to the electromechanical conversion element, for providing a vibration wave in the drive surface in response to excitation of the electromechanical conversion element by the drive signal, a contact member or movable element in pressure contact with the drive surface of said elastic body, and an adhesive layer for joining the electromechanical conversion element and the elastic body, wherein the adhesive layer is chosen for having either a specific thermal expansion coefficient, a specific shrinkage volume of an adhesive agent, high Vickers hardness, a high longitudinal elastic modulus, or a high Vickers hardness and a high longitudinal elastic modulus.

BRIEF DESCRIPTION OF THE DRAWINGS

These and other objects and advantages of the invention will become apparent and more readily appreciated from the following description of the preferred embodiments, taken in conjunction with the accompanying drawings of which.

DESCRIPTION Of THE PREFERRED EMBODIMENTS

Figure 1:
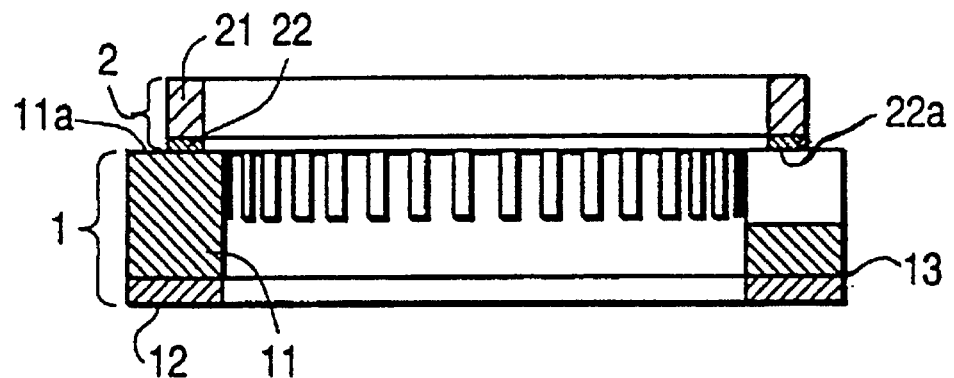
FIG. 1 is a diagram illustrating an overall configuration of an embodiment of the present invention.

Reference will now be made in detail to preferred embodiments of the present invention, examples of which are illustrated in the accompanying drawings, wherein like reference numerals refer to like elements throughout.

FIG. 1 is a diagram showing an embodiment of an ultrasonic motor according to the present invention.

Stator 1, constituted by piezoelectric body 12 and elastic body 11, provides a traveling vibration wave on drive surface 11a due to the excitation of adjoined piezoelectric body 12. Piezoelectric body 12 is excited by drive signals. Stator 1 is supported by a support body (not illustrated).

Movable element 2 is constituted by movable element base material 21 connected to an object to be moved (not illustrated), and sliding member 22 in pressure contact with drive surface 11a of elastic body 11 by sliding surface 22a.

Piezoelectric body 12 and elastic body 11 are joined by an adhesive layer 13 in which an adhesive is used having a Vickers hardness Hv=8.0 or more.

Figure 2:
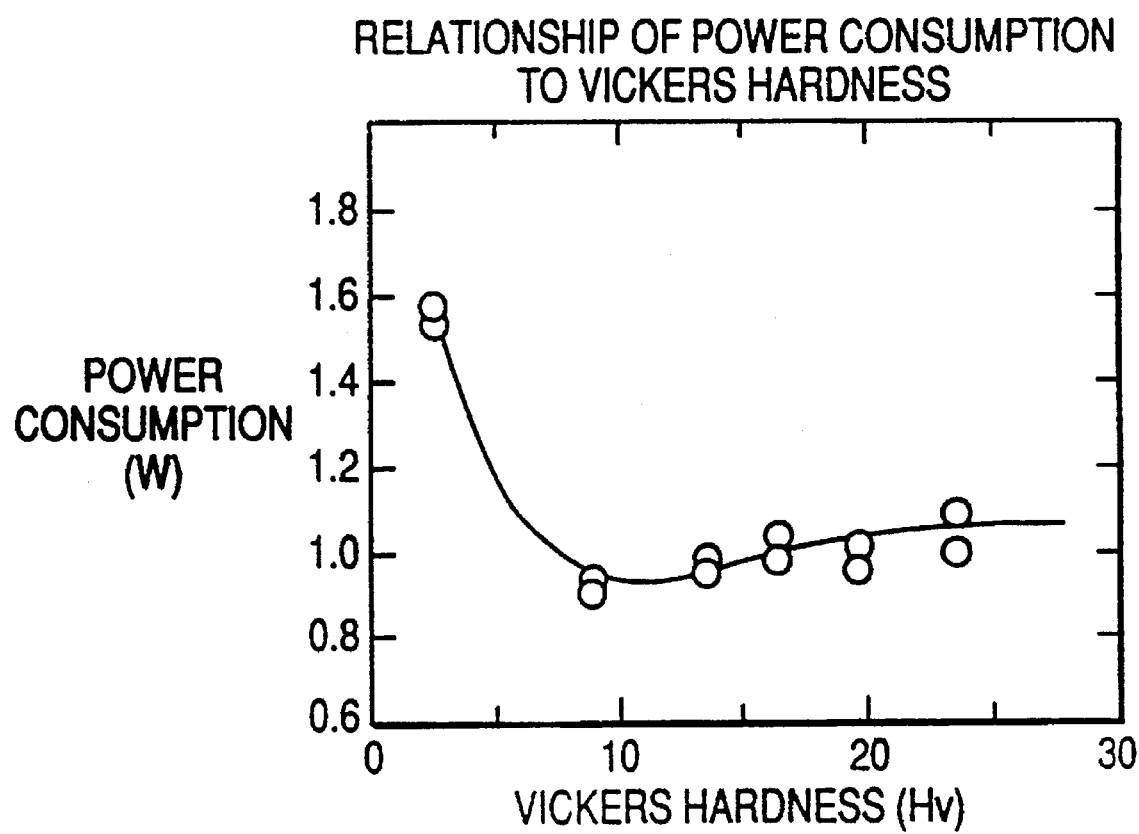
FIG. 2 is a graph showing the relationship between the hardness of an adhesive layer and the power consumption.

FIG. 2 is a graph showing the relationship between the hardness of an adhesive of adhesive layer 13 and the power consumption when the amplitude of the traveling wave generated in elastic body 11 is constant.

The hardness on the abscissa was obtained by changing the amount of a hardening agent relative to a main agent in a two solution type epoxy based adhesive. The main agent was an epoxy resin.

The point at which hardness was lowest is a case in which polysulfide was used as the main constituent in the hardening agent. The point at which hardness is second lowest occurs where an aliphatic polyamine was used as the main constituent in the hardening agent. Furthermore, various hardness levels could be obtained by varying the content of the aliphatic polyamine.

The power consumption on the ordinate is the power consumption value when the amplitude of the traveling wave generated in elastic body 11 reached a fixed value with stator 1 prepared according to the hardening conditions required to provide the hardness obtained in the above-mentioned trials.

It can be seen from FIG. 2 that the power consumption becomes large at a hardness of the adhesive layer 13 of Hv=8.0 or less. Large power consumption results in the vibrational energy transmitted from piezoelectric body 12 to elastic body 11 being excessively reduced in transmission. An adhesive layer 13 of low hardness has the property of great flexibility; however, the energy transmitted from the piezoelectric body 12 to the elastic body 11 is greatly attenuated.

In the above manner, when the hardness of the adhesive used to join piezoelectric body 12 and elastic body 11 was Hv=8.0 or more, the attenuation of energy transmitted from piezoelectric body 12 to elastic body 11 was reduced.

As an adhesive of which the hardness property becomes Hv=8.0 or more on hardening, suitable low power consumption results were obtained with the adhesives shown in Table I in the present embodiment.

TABLE I

| Type | Trade Name | Hv |
| --- | --- | --- |
| Single solution type epoxy | 89A20 (Sony Chemical Co.) | 21 |
| | 2210 (Three Bond Co.) | 19 |
| | EP171 (Semadain Co.) | 20 |
| | Bond E30 (Konishi Co.) | 17 |
| Two solution type epoxy | Main agent 2023 + hardener 2103 (Three Bond Co.) | 14 |
| | Main agent 1565 + hardener D (Semadain Co.) | 19 |
| Anaerobic methacrylate type | SA-550 (Toyo Ink Manufacturing Co.) | 16 |

Moreover, power consumption was low with the Vickers hardness of adhesive layer 13 in the region of Hv=8–15; however, power consumption was low at an even higher Vickers hardness.

Deformation of stator 1 due to residual stress arising during hardening has an adverse effect on the traveling wave generation, This deformation is relaxed because of a certain softness of adhesive layer 13. However, although softness of adhesion layer 13 relaxes deformation of stator 1, this softness causes an attenuation of the vibration of stator 1, thereby resulting in an increase of electric current consumption.

In the above embodiment, piezoelectric layer 12 and elastic layer 11 are joined by adhesive layer 13 using an adhesive having a Vickers hardness Hv=8.0 or more. In the following embodiment, piezoelectric body 12 and elastic body 11 are joined by adhesive layer 13 using an adhesive having a longitudinal elastic modulus E=180 kgf/mm². The overall embodiment constitution is the same as that previously described for and illustrated in the embodiment of FIG. 1 and an additional description therefore is omitted.

Figure 3:
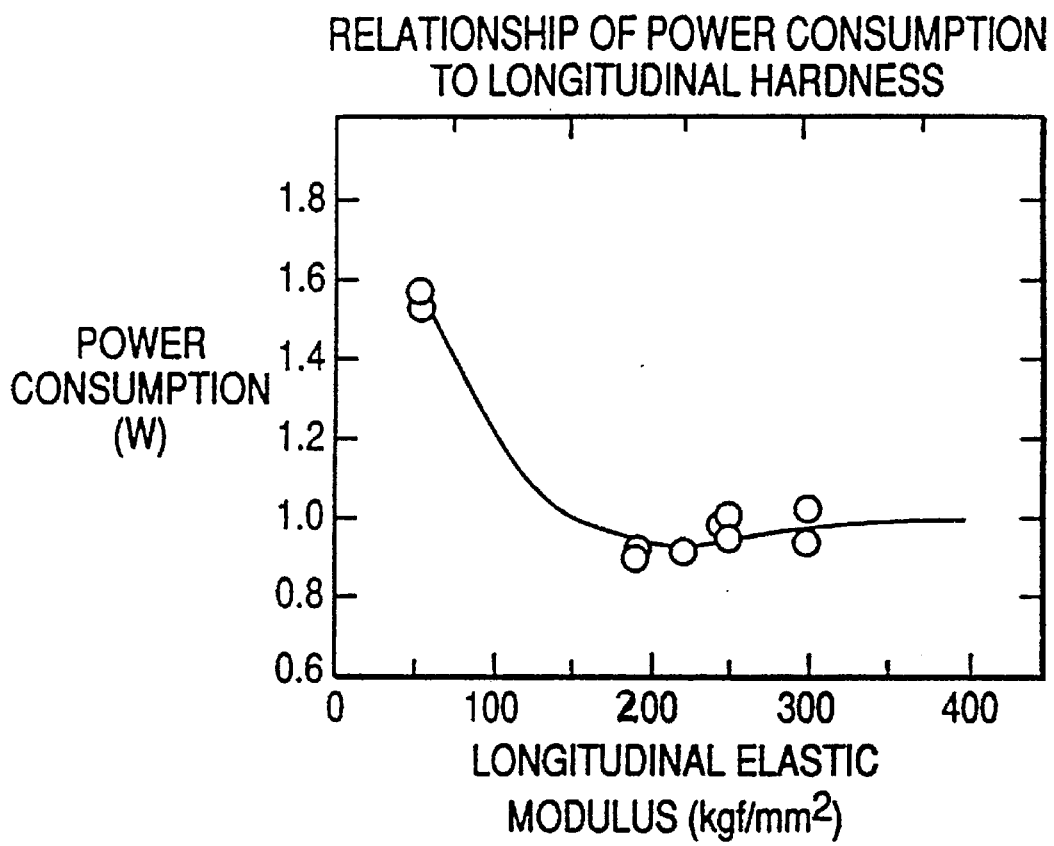
FIG. 3 is a graph showing the relationship between the longitudinal elastic modulus and the power consumption.

FIG. 3 is a graph showing the relationship between power consumption and longitudinal elastic modulus of the adhesive of adhesive layer 13. The amplitude of the traveling wave generated in the elastic layer is kept constant.

The longitudinal elastic modulus on the abscissa was obtained by changing the constituent or the content of the hardening agent in relation to the main agent of a two solution type epoxy adhesive. The main agent used an epoxy resin intermediate as the main constituent.

The lowest point of the longitudinal elastic modulus was the case of using a polysulfide as the main constituent in the hardening agent; aliphatic polyamine was used as the main constituent in the hardening agent for the second lowest point of the longitudinal elastic modulus. Furthermore, by varying the content of the aliphatic polyamine as the main constituent, various longitudinal elastic moduli can be obtained.

The measurement of the longitudinal elastic modulus was performed by the method of measuring the bending moment of a test piece, based on the provisions of well-known Japanese testing procedures referenced as JIS K7106. The test pieces were obtained by flowing the adhesive into molds of uniform thickness and then hardened. The adhesive was then cut to required dimensions.

The power consumption on the ordinate according to the longitudinal modulus obtained in the above-mentioned trials represents the power consumption value when transmitted. The traveling wave generated in elastic body 11 was a fixed value and stators 1 were manufactured by means of hardening conditions.

As illustrated in FIG. 3, power consumption in adhesive layer 13 increases when the longitudinal elastic modulus E=180 kgf/mm² or less. A large power consumption means that the vibrational energy transmitted from piezoelectric body 12 to elastic body 11 becomes reduced in transmission. Therefore, in an adhesive layer 13 having the property of a small longitudinal elastic modulus, a consumption of vibrational energy takes place due to the expansion and contraction of adhesive layer 13 itself and the vibrational energy is greatly attenuated during transmission from piezoelectric body 12 to elastic body 11.

In the above manner, with a longitudinal elastic modulus E=180 kgf/mm² of the adhesive used to join piezoelectric body 12 and elastic body 11, the attenuation of the vibrational energy transmitted from piezoelectric body 12 to elastic body 11 is reduced.

As an adhesive having the property of a longitudinal elastic modulus E=180 kgf/mm² or more on hardening, there are the adhesives shown in Table II, with which suitable results (low power consumption) can be obtained.

TABLE II

| Kind | Trade Name | Longitudinal Elastic Modulus, kgf/mm² |
|---|---|---|
| One solution type epoxy | 89A20 (Sony Chemical Co.) | 300 |
| | Bond E30 (Konishi Co.) | 260 |
| Two solution type epoxy | Main agent 1565 + hardener D (Semadain Co.) | 250 |
| | Main agent 2023 + hardener 2103 (Three Bond Co.) | 180 |

The power consumption is generally low with the longitudinal elastic modulus of adhesive layer 13 in the region of E=180–220 kgf/mm² and power consumption remains low even when the longitudinal elastic modulus is increased. Low power consumption results because deformation arises due to residual stress of the stator resulting from the shrinkage of the adhesive at the time of hardening, thereby having an adverse effect on the traveling wave generation; however, adhesive layer 13 of a properly selected longitudinal elastic modulus statically expands and contracts due to a state of residual stress, thereby relaxing the deformation of the stator.

When the longitudinal elastic modulus becomes lower than the 180–220 kgf/mm² range, the deformation of stator 1 is relaxed and the vibration of the stator is attenuated; however, the power consumption is increased.

In the above embodiments, the adhesive used to join piezoelectric body 12 and elastic body 11 had a Vickers hardness of Hv=8.0 or more or a longitudinal elastic modulus of E=180 kgf/mm². However, an embodiment is also described wherein the adhesive used to join piezoelectric body 12 and elastic body 11 has a Vickers hardness Hv=8.0 or more and a longitudinal elastic modulus E=180 kgf/mm² or more. In this embodiment, in addition to the attenuation of the vibration in adhesive layer 13 being reduced, the energy which maintains the expansion and contraction vibration of adhesive layer 13 itself is also reduced. This combination of Vickers hardness and longitudinal elastic modulus produces a further reduction in attenuation of the energy transmitted from piezoelectric body 12 to elastic body 11.

While the above embodiment utilized an adhesive having a longitudinal elastic modulus E=180 kgf/mm² or more to join piezoelectric body 12 and elastic body 11, a further embodiment is described which uses adhesives shown in Table III wherein suitable power consumption results were obtained in that power consumption was low.

The method of measurement of the longitudinal elastic modulus was performed based on well-known Japanese testing provisions referred to as JIS K7106. Test pieces were obtained by flowing the adhesive into molds of uniform thickness and then hardening. Afterwards, the adhesive was cut to stipulated dimensions.

TABLE III

| Kind | Trade Name | Longitudinal Elastic Modulus, kgf/mm² |
|---|---|---|
| Single solution type epoxy | 2210 (Three Bond Co.) | 290 |
| | EP171 (Semadain Co.) | 310 |
| Anaerobic methacrylate type | SA-550 (Toyo Ink Manufacturing Co.) | 270 |

Figure 4:
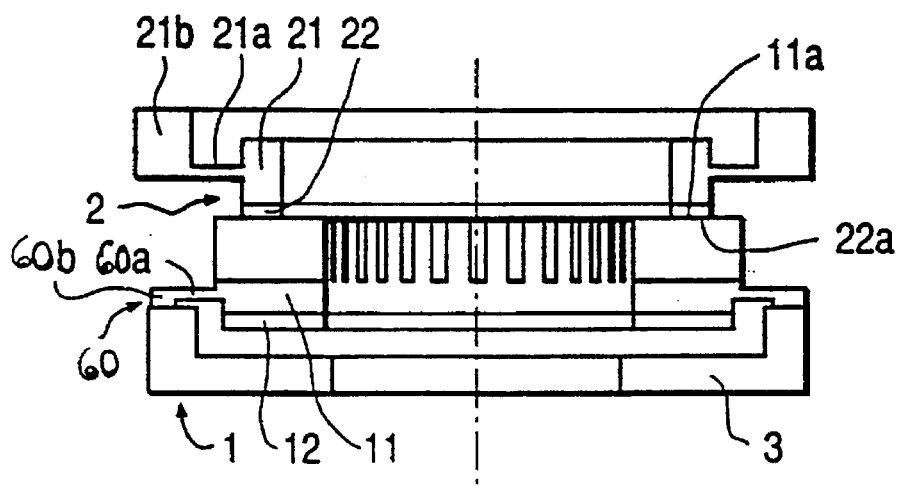
FIG. 4 is a diagram illustrating an overall configuration of an embodiment of the present invention.

FIG. 4 is a diagram showing an additional embodiment of an ultrasonic motor according to the present invention. Elements or portions performing the same functions as in the embodiment of FIG. 1 are referenced by the same symbols and need not be further discussed again here.

Stator 1 is constituted by piezoelectric body 12 and elastic body 11 joined to piezoelectric body 12. Piezoelectric body 12 is excited by drive signals. Elastic body 11 has a drive surface 11a in which a vibration wave arises due to the aforementioned excitation. Flange 60 is formed at the external circumferential surface of elastic body 11. Flange 60 consists of a thin portion 60a connected to elastic body 11 and a thick portion 60b connected to the external edge of thin portion 60a. Thick portion 60b is joined to stator support body 3.

Movable element 2 is constituted by a movable element base member 21 and a sliding member 22. Sliding member 22 is in pressure contact with the drive surface 11a of elastic body 11 by sliding surface 22a. Flange 21a is formed on the external circumferential surface of movable element base member 21, and a thick portion 21b is connected to its outer edge. This thick portion 21b is subject to a pressure force by means of a pressure member (not illustrated). Sliding surface 22a and drive surface 11a are in contact under pressure.

The drive force of elastic body 11 is frictionally transmitted to movable element 2 and the movable element 2 is driven.

In this embodiment, piezoelectric body 12 and elastic body 11 have respectively been joined by an elastic layer which uses an adhesive of Vickers hardness Hv=8.0 or more, an elastic layer which uses an adhesive of longitudinal elastic modulus E=180 kgf/mm² or more, or an elastic layer which uses an adhesive of Vickers hardness Hv=8.0 or more and a longitudinal elastic modulus E=180 kgf/mm² or more.

Table IV shows, according to this embodiment, the characteristics of adhesive layers in which adhesives have been used which have both a Vickers hardness Hv=8.0 or more and a longitudinal elastic modulus E=180 kgf/mm² or more.

The power consumption shown is the electric power necessary for a rated drive time (when a certain rotational speed is generated under a certain load); smaller values of power consumption represent an increase in drive efficiency.

In order to do away with effects relating to factors other than the characteristics of the adhesive when taking measurements for Table IV, the elastic bodies 11 used were manufactured under the same conditions, from the same lot and to the same dimensions. In addition, piezoelectric bodies 12 used were of the same material and the same dimensions. Adhesion was performed by the same operator on the same day and at about the same time. Moreover, movable elements 2 used to measure performance were the same in each of the measurements.

By using the adhesives shown in Table IV in ultrasonic motors, the resonance resistance and power consumption can be reduced.

TABLE IV

| Kind Consumption | Trade Name | Hardness Hv | L.E.M.* kgf/mm² | Resonance Resistance Ω | Power W |
|---|---|---|---|---|---|
| One solution epoxy | 89A20 (Sony Chem)* | 21 | 300 | 100 | 0.97 |
| | 2210 (Three Bond) | 19 | 290 | 107 | 0.96 |
| | Bond E30 (Konishi Co.) | 17 | 260 | 90 | 0.91 |
| Two solution epoxy | Main 1565 + Hardener D (Semadain) | 19 | 250 | 102 | 0.94 |
| Comparison example | Main 1565 + Hardener 1565 (Semadain) | 2 | 40 | 145 | 1.29 |

*L.E.M. = longitudinal elastic modulus; Sony Chem = Sony Chemical Co.; Three Bond = Three Bond Co.; Semadain = Semadain Co.

Figure 5A:
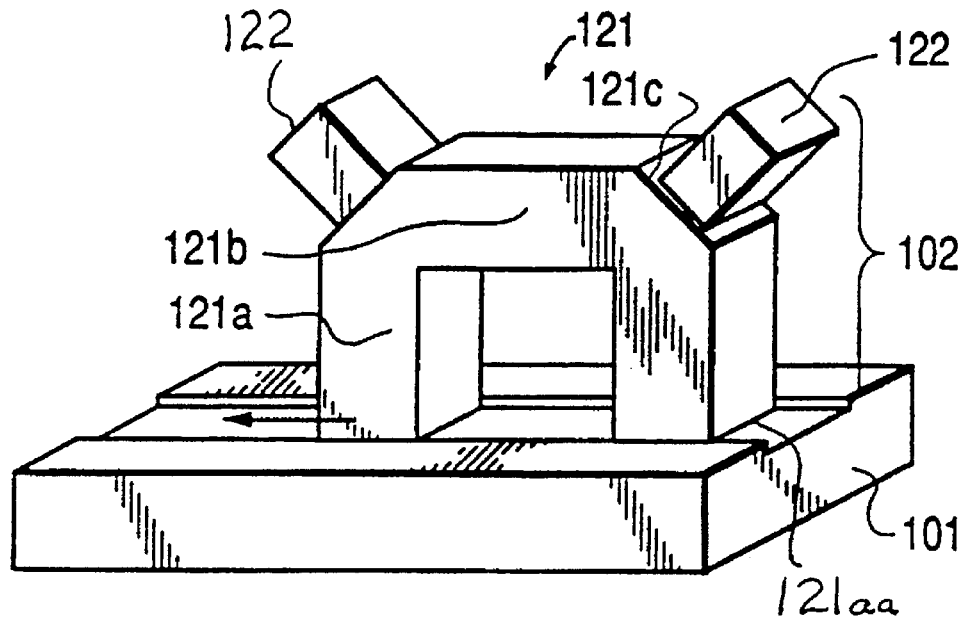
FIGS. 5(A) and 5(B) are diagrams illustrating an additional embodiment of the present invention.
Figure 5B:
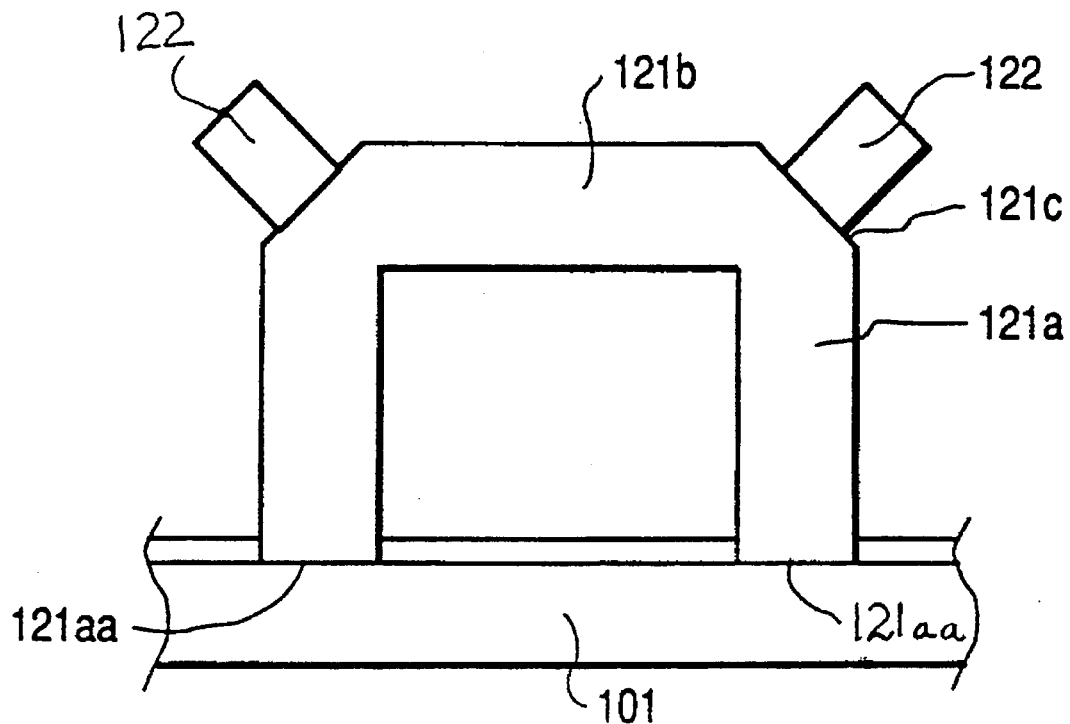

FIGS. 5(A) and 5(B) are diagrams showing a further embodiment of an ultrasonic motor according to the present invention. In the previous embodiments, an annular form of traveling wave ultrasonic motor has been described, but in this embodiment, an embodiment is described which is suitable for a movable element of an ultrasonic motor which does not use a traveling wave. This embodiment could use, for example, a linear type of ultrasonic actuator.

As the drive principle of this type of ultrasonic motor is disclosed in JA-A-1-315282 (Japanese Laid-Open Patent Publication 1-315282), a synoptic description will be given here.

Referring now to FIGS. 5(A) and 5(B), movable member 102 is constituted by elastic body 121 and piezoelectric body 122. Elastic body 121 includes two mutually parallel drive portions 121a making up end drive surfaces 121aa, and a connecting portion 121b connecting the respective drive portions 121a; chamfer portions 121c are formed on portions joining drive portions 121a and connecting portion 121b. Vibration waves are generated in drive surfaces 121aa, by the excitation of piezoelectric body 122. Piezoelectric bodies 122, disposed on the chamfer portions 121c, are excited by drive signals.

By means of this type of constitution, vibratory waves are generated in end drive surfaces 121aa, of elastic body 121 by drive signals of piezoelectric bodies 122 and movable element 102 is driven by the reaction force of stator 101.

In a preferred embodiment of the present invention, elastic body 121 and piezoelectric bodies 122 are respectively joined by adhesive layers using an adhesive having a Vickers hardness Hv=8.0 or more, a longitudinal elastic modulus E=180 kgf/mm² or more, or a Vickers hardness Hv=8.0 or more and also a longitudinal elastic modulus E=180 kgf/mm² or more. With this type of adhesive, the attenuation of vibrational energy transmitted from piezoelectric bodies 122 can be reduced and the drive efficiency of the ultrasonic motor can be greatly increased.

In the above-mentioned embodiments, an annular form of traveling wave ultrasonic motor was used; however, a linear type or standing wave type of ultrasonic motor could also be used. As related by the present invention for all ultrasonic motors which use an adhesive for the junction of a piezoelectric body and an elastic body, attenuation of the energy transmission from the piezoelectric body to the elastic body can be reduced if the adhesive is selected to have a Vickers hardness Hv=8.0 or more, or a longitudinal elastic modulus of 180 kgf/mm² or more, or both of these properties.

Moreover, in the above-mentioned embodiments, the electromechanical conversion element has been described as a piezoelectric element, but an electrostrictive element may be used.

In summary, by means of the invention as described above, the attenuation of the vibrational energy transmitted from an electromechanical conversion element (such as a piezoelectric body) to an elastic body is reduced by the use of an adhesive having a high hardness (for example, Hv=8.0 or more) to join the electromechanical conversion element and the elastic body. In this manner, the starting torque, power consumption and drive efficiency of an ultrasonic motor can be improved.

Moreover, attenuation of the vibrational energy transmitted from a piezoelectric body to an elastic body is reduced by the use of an adhesive having a high longitudinal elastic modulus (for example, E=180 kgf/mm² or more) to join the piezoelectric body and the elastic body. In this manner, the starting torque, power consumption and drive efficiency of the ultrasonic motor can be improved.

Furthermore, attenuation of the vibrational energy transmitted from the piezoelectric body to the elastic body is reduced by the use of an adhesive having both a high hardness and a high longitudinal elastic modulus (for example, Hv=8.0 or more, and also E=180 kgf/mm² or more) to join the piezoelectric body and the elastic body. In this manner, the starting torque, power consumption and the drive efficiency of the ultrasonic motor can be greatly improved.

The present invention solves the afore-mentioned problems of the prior art by the following means. A piezoelectric body (or electromechanical conversion element) 12, or a stator 1 having a piezoelectric body 12, is excited by a drive signal and an elastic body 11, joined to electromechanical conversion element 12, gives rise to a vibration wave in a drive surface 11a by means of the excitation. A movable element (or a contact member) 2 is in pressure contact with drive surface 11a. Movable element 2 or elastic body 11 is driven by a vibration wave. An adhesive layer 13 is provided in which an adhesive agent of high hardness has been used to join piezoelectric body 12 and elastic body 11.

An additional embodiment provides an adhesive layer 13 using an adhesive having a Vickers hardness of Hv=8.0 or more. Because the adhesive joining piezoelectric body 12 and elastic body 11 has a high hardness, the attenuation of the energy transmitted from piezoelectric body 12 to elastic body 11 is reduced.

Moreover, a further embodiment provides an adhesive layer 13 having an adhesive of high longitudinal elastic modulus.

Yet another embodiment provides an adhesive layer 13 having an adhesive with a longitudinal elastic modulus of E=180 kgf/mm² or more. When the longitudinal elastic modulus of the adhesive used to join piezoelectric body 12 and elastic body 11 is made high, the attenuation of the energy transmitted from the piezoelectric body 12 to the elastic body 11 is reduced.

Furthermore, another embodiment provides an adhesive layer 13 having an adhesive agent of high hardness and also high longitudinal elastic modulus.

An additional embodiment provides an adhesive layer 13 having a Vickers hardness of Hv=8.0 or more, and also a longitudinal elastic modulus of E=180 kgf/mm² or more. Because both the hardness and the longitudinal elastic modulus of the adhesive used to join the piezoelectric body 12 and the elastic body 11 have been made high, the attenuation of the energy transmitted from piezoelectric body 12 to elastic body 11 is reduced.

A present embodiment also provides an adhesive layer 13 having an adhesive which is either a one-solution epoxy type or a two-solution epoxy type, with an epoxy compound as the main agent and a polyamine as the hardening agent.

In previously-described embodiments, elastic body 11 is integrally joined to a piezoelectric body 12 and elastic body 11 is thus excited by the vibration of the piezoelectric body 12. Because elastic body 11 and piezoelectric body 12 are made of special materials, elastic body 11 and piezoelectric body 12 differ greatly in thermal expansion coefficient. Since the amount of expansion for a temperature change differs, stator 1 deforms due to temperature changes.

In order to prevent this phenomenon, an elastic body and an electrostrictive element of about the same thermal expansion coefficient was proposed in JP-A-60-62883 (Japanese Laid-Open Patent Publication 60-62883). However, while the thermal expansion coefficients of the elastic body and the piezoelectric body were about the same, it must be considered that an adhesive layer exists between these elements.

The thermal expansion coefficient of the adhesive layer is in many cases generally 1-2 orders of magnitude greater than the thermal expansion coefficient of a metal or piezoelectric body. Accordingly, the thermal expansion coefficient of the adhesive layer differed greatly from that of the elastic body or piezoelectric body and, in this case, the amount of deformation of the adhesive layer for a given temperature change is different from the amount of deformation of elastic body 11 or piezoelectric body 12.

Adhesive layer 13 used for joining, in order to fulfill its role in reliably transmitting vibrations of piezoelectric body 12 to elastic body 11, does not absorb differences in the amount of deformation due to adhesive layer 13 having a different amount of deformation. Because of this, stator 1 is deformed.

Figure 6:
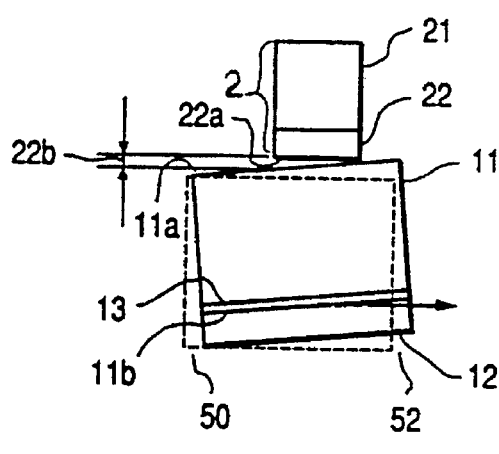
FIG. 6 is a diagram illustrating the deformation of a stator when the temperature changes.

FIG. 6 is a diagram which illustrates the deformation of stator 1 when the temperature changes towards the high temperature side and the thermal expansion coefficient of adhesive layer 13 is greater than that of elastic body 11 or piezoelectric body 12. Reference 50 represents the external diameter side of elastic body 11 and reference 52 represents the internal diameter side of elastic body 11.

Because the amount of deformation of adhesive layer 13 becomes greater than that of elastic body 11 or piezoelectric body 12, the junction surface 11b of elastic body 11 receives shearing stress and junction surface 11b is stretched on the external diameter side 50. Because no external forces acted on the exterior of junction surface 11b, the internal diameter side 52 of drive surface 11a of elastic body 11 undergoes a concave deformation.

Adhesive layer 13 is between elastic body 11 and piezoelectric body 12; however, because the rigidity of elastic body 11 becomes greater then the rigidity of piezoelectric layer 12 due to the nature of thickness and other factors, the internal diameter side 52 of drive surface 11a of elastic body 11 becomes convexly deformed.

Accordingly, as illustrated in FIG. 6, elastic body drive surface 11a and sliding surface 22a of movable element 2 are placed in contact. The internal diameter side 52 of movable element 2 is in contact with drive surface 11a; however, the external diameter side 50 of movable element 2 separates from drive surface 11a and a clearance 22b arises.

As a result of temperature changes, the contact surface area of the movable element sliding surface 22a and the elastic body drive surface 11a becomes smaller and, due to this problem, the starting torque or power consumption of the ultrasonic motor changes and/or the performance of the drive efficiency of movable element 2 changes.

The present invention, taking these problems into account, has as its object to provide an ultrasonic motor in which the adhesion area with movable element 2 is maintained by a reduction of the deformation of elastic body 11 due to temperature changes. Therefore, even when the temperature changes, changes in the starting torque, power consumption and drive efficiency of the movable element can be decreased while obtaining about the same performance.

An embodiment of the present invention addressing these problems is described in detail below, with reference to FIG. 1. Piezoelectric body 12 and elastic body 11 are joined by adhesive layer 13 which uses an adhesive having a thermal expansion coefficient approximately the same as that of the piezoelectric body 12 and of the elastic body 11.

By the above constitution, the adhesive used in the junction of piezoelectric body 12 and elastic body 11 has a thermal expansion coefficient about the same as that of piezoelectric body 12 or elastic body 11, so that the amounts of expansion and contraction of piezoelectric body 12 and elastic body 11 accompanying temperature changes will be approximately the same.

In this manner, deformation of elastic body 11 can be prevented, reduction of the contact surface area of the elastic body drive surface 11a and movable element sliding surface 22a accompanying temperature changes can be improved, and sufficient starting torque and drive efficiency of movable element 2 can be increased.

Residual stress occurs in elastic body 11 or piezoelectric body 12 when elastic body 11 or piezoelectric body 12 is deformed due to the adhesive. In particular, when there is residual stress in piezoelectric body 12, the expansion and contraction of piezoelectric body 12 requires excessive power consumption. Accordingly, by a reduction of the deformation of piezoelectric body 12, an increase in current consumption can be prevented and drive efficiency increased.

Since, in a normal temperature region, piezoelectric body 12 is a material having a low thermal expansion coefficient of $0.1 \times 10^{-5}$–$0.5 \times 10^{-5}$/°C., a material of elastic body 11 is preferably used having a thermal expansion coefficient about the same as that of the piezoelectric body 12.

For example, an Invar material (in a normal temperature range, about $0.1 \times 10^{-5}$–$0.3 \times 10^{-5}$/°C.) or a nickel base alloy such as 42 alloy (in a normal temperature range, about $0.4 \times 10^{-5}$–$1.0 \times 10^{-5}$/°C.), or an iron base alloy such as SUS (in a normal temperature range, $0.9 \times 10^{-5}$–$1.8 \times 10^{-5}$/°C.) should be used.

In the case of adhering piezoelectric body 12 and elastic body 11, it is preferable for the thermal expansion coefficient of the adhesive used in adhesive layer 13 to be about the same value as that of piezoelectric body 12 and elastic body 11.

Specifically, as shown in Table V for an adhesive having a thermal expansion coefficient of $5.0 \times 10^{-5}$/°C. or less, the deformation of stator 1 due to temperature changes can be small. Therefore, favorable effects can be obtained on the starting torque and power consumption of the ultrasonic motor, or in reducing changes of the performance of the drive efficiency and the like of movable element 2.

TABLE V

| Main Constituent | Product Name | Thermal Expansion Coefficient, × $10^{-5}$/°C. |
| --- | --- | --- |
| zirconia, silica | Aron Ceramic E[1] | 0.4 |
| alumina | Aron Ceramic D[1] | 0.8 |
| silica | Aron Ceramic C[1] | 1.3 |
| one-solution type epoxy resin | 2212 (Three Bond Co.) | 4.4 |
| two-solution type epoxy resin | 2023 + 2103 (Three Bond Co.) | 5.0 |

[1]Toa Synthetic Chemical Co.

Various modifications and changes in the above embodiment are possible. In the present embodiment, when the thermal expansion coefficient of the adhesive is $5.0 \times 10^{-5}$/°C. or less, there is great improvement in motor operation during temperature changes; however, even with adhesives of fairly small thermal expansion coefficients (for example, $7.0 \times 10^{-5}$/°C. or $9.0 \times 10^{-5}$/°C. and the like), the deformation of the stator 1 can be reduced, the starting torque or power consumption of the ultrasonic motor can be improved, the drive efficiency of movable element 2 can be improved, and changes of performance can be sufficiently reduced for temperature changes.

Moreover, in the present embodiment, the electromechanical conversion element is described as a piezoelectric element, but it may be an electrostrictive element.

As described for the present invention, by making the thermal expansion coefficient of the adhesive used for joining elastic body 11 and piezoelectric body 12 about the same as that of elastic body 11 and piezoelectric body 12, deformation of stator 1 when temperature changes occur can be reduced.

In this manner, a reduction of the contact surface area of the elastic body drive surface 11a and the movable element sliding surface 22a can be prevented, and changes of the starting torque or electric power consumption, and changes of the performance of the drive efficiency of the movable body, can be reduced. An ultrasonic motor according to this embodiment of the present invention includes a stator 1 having a piezoelectric body 12 (an electromechanical conversion element) excited by a drive signal and an elastic body 11, joined to this piezoelectric body 12, to give rise to a traveling vibration wave in a drive surface by means of an excitation. A movable element 2 driven by the traveling vibration wave is in pressure contact with the drive surface 11a of elastic body 11. Adhesive layer 13, which uses an adhesive agent having a thermal expansion coefficient approximately the same as that of the piezoelectric 12, joins piezoelectric body 12 and elastic body 11.

In a preferred embodiment, adhesive layer 13 uses an adhesive with a thermal expansion coefficient of $5.0 \times 10^{-5}$/°C. or less.

Since adhesion layer 13 has about the same thermal expansion coefficient as piezoelectric body 12 and elastic body 11, amounts of expansion and amounts of contraction of elastic body 11, piezoelectric body 12 or adhesive layer 13 can be about the same.

In this manner, the deformation of the elastic body 11 can be prevented, the reduction of the contact surface of the elastic body drive surface 11a and the movable element sliding surface 22a can be improved and, even if there are temperature changes, changes in the starting torque and power consumption, and changes in the drive performance of movable element 2 can be reduced.

The following additional embodiment recognizes that it is preferable to use an adhesive which is comparatively hard after setting to join elastic body 11 and piezoelectric body 12 since adhesive layer 13 has the role of reliably transmitting the vibration of piezoelectric body 12 to elastic body 11.

Moreover, there are many adhesives which set by chemical reaction. Such adhesives almost always shrink after setting. In the case of an adhesive that has shrunk, the material which is adhered is pulled in the direction of shrinkage. When an adhesive which has become comparatively hard after setting, the action of the adhesive itself in absorbing the tensile stress of the adhered material becomes small and the adhered material is deformed.

There are many cases of traveling wave ultrasonic motors of toroidal configuration, in which the elastic body has a hollow configuration, the cross sectional width or height relative to the diameter is very small, and deformation occurs easily in the diametral direction with a motor having a comb gear configuration.

In addition, when the diameter of elastic body 11 becomes large, the joint surface is pulled on the internal diameter side due to the shrinkage of adhesive layer 13 because the amount of shrinkage of adhesive layer 13 after setting becomes large. As a result, the drive surface is observed to deform in a convex configuration.

Referring now to FIG. 1, the following embodiment assumes that piezoelectric element 12 and elastic element 11 are joined by an adhesive layer 13 which uses an adhesive having low shrinkage during setting.

Figure 7:
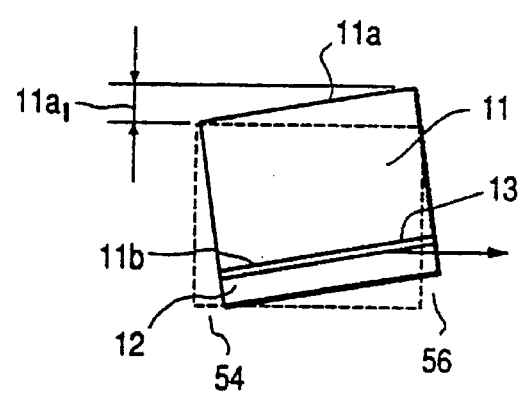
FIG. 7 is a diagram illustrating a convex deformation of a stator.

FIG. 7 is an illustrative diagram showing an observational example of the deformation of an elastic body and a piezoelectric body due to shrinkage of the adhesive. Line 54 represents the external diameter side of elastic body 11 and line 56 represents the internal diameter side of elastic body 11.

When the diameter of elastic body 11 is 50 mm or more and joining is by an adhesive of volume shrinkage about 9%, the height difference $11a_1$ of the internal diameter side 56 and external diameter side 54 of elastic body 11 is about 8 μm. This occurs with an adhesive of a two-liquid type epoxy.

FIG. 6, as previously described, is a diagram showing an elastic body drive surface 11a and a sliding surface 22a of movable element 2 in contact. In FIG. 6, the internal diameter side 52 of movable element 2 is in contact with elastic body drive surface 11a. However, the external diameter side 50 becomes separated from elastic body drive surface 11a by a separation distance 22b. Separation distance 22b is typically equal to several μm. Due to this separation, the contact area of movable element sliding surface 22a and elastic body drive surface 11a is reduced. In this manner, due to the deformation of elastic body drive surface 11a caused by shrinkage of adhesive layer 13, the contact surface area of movable element sliding surface 22a and elastic element drive surface 11a is reduced. This reduction in contact area creates a problem in that a sufficient starting torque of the ultrasonic motor is not obtained and drive efficiency is reduced.

The present invention, in order to solve the above-mentioned problems, also has as its object to provide an ultrasonic motor with which a sufficient starting torque is obtained and the drive efficiency is increased by a reduction of the deformation of elastic body 11 to maintain the surface area of contact with movable element 2.

Referring now to FIG. 6, when the adhesive of the adhesive layer 13 shrinks, a shearing stress is received at the junction surface 11b of elastic body 11; the junction surface 11b is stretched on the internal diameter side 52. Elastic body 11, because it receives no external forces other than at the junction surface 11b, deforms as a result such that the internal diameter side 52 of drive surface 11a becomes convex.

The adhesive layer 13 is present between elastic body 11 and piezoelectric body 12; however, because the rigidity of elastic body 11 becomes greater than the rigidity of piezoelectric layer 12 due to the nature, thickness and other factors of the materials, the internal diameter side 52 of elastic body drive surface 11a becomes convexly deformed.

When the adhesive of the adhesive layer 13 has a low shrinkage at the time of setting, the difference ($11a_1$ in FIG. 7) in height of the external diameter side 54 and the internal diameter side 56 of drive surface 11a can be reduced. Specifically, if an adhesive is used which has a shrinkage of 3% or less during setting, it was observed that the height difference $11a_1$ could be 2 μm or less.

Furthermore, when drive surface 11a is in contact with and under pressure with movable element 2, the operation is such that the clearance becomes zero due to the surface roughness of the elastic body drive surface 11a or of the movable element sliding surface 22a, or due to the minute elastic deformation caused by the pressure contact of movable element 2 and the elastic body 11.

Accordingly, the contact surface area of movable element sliding surface 22a and elastic body drive surface 11a is no longer reduced, the problem of a decrease of drive efficiency can be solved and it becomes possible to obtain sufficient starting torque.

Elastic body 11 or piezoelectric body 12, joined by adhesive, has residual strain present in elastic body 11 or piezoelectric body 12. In particular, when there is residual strain in piezoelectric body 12, the expansion deformation of piezoelectric body 12 requires an excessive consumption of electric power. Accordingly, by reduction of the deformation of piezoelectric body 12, the increase in electric current consumption is also prevented and the drive efficiency can be increased.

Moreover, as shown in FIG. 6, when a movable element 2 having a width smaller than the width of elastic body 11 is placed in contact, the clearance 22b which arises at the elastic body drive surface 11a and the external diameter side 50 of movable element sliding surface 22a can be reduced and the state of contact of movable element drive surface 22a and elastic body drive surface 11a is improved.

Suitable results were obtained in the present embodiment when using, as an adhesive of volume shrinkage 3% or less, the single solution type epoxy based adhesives Bondo E30 (Konishi Co.) or 2210 (Three Bond Co.), or the cyanoacrylate based adhesive Super Three Cement 1000 (Three Bond Co.).

Figure 8:
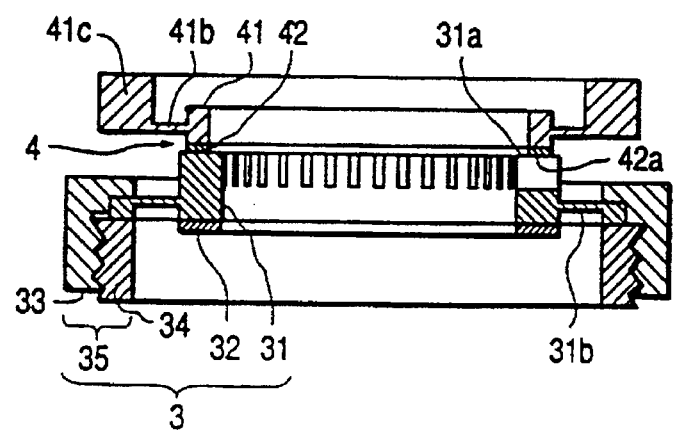
FIG. 8 is a diagram illustrating a further embodiment of the present invention.

FIG. 8 is a diagram showing still a further embodiment of an ultrasonic motor according to the present invention. In FIG. 8, stator 3 is constituted by a piezoelectric body 32 excited by drive signals. Elastic body 31 of a comb gear configuration is joined to piezoelectric body 32 and gives rise to a traveling vibration wave in the drive surface 31a due to the excitation vibration. A support body 35 including a fixed ring 33 and a presser ring 34 supporting elastic body 31 via a thin sheet portion 31b of the elastic body 31.

Movable element 4 is constituted by a movable element base material 41 having a thin plate portion 41b, a connection portion 41c connected to an object (not illustrated) which is intended to be moved, and a sliding member 42 in pressure contact with the drive surface 31a of elastic body 31 by a sliding surface 42a joined to moving element base material 41.

Piezoelectric body 32 and elastic body 31 are joined by an adhesive layer using an adhesive whose volume shrinkage during setting is 3% or less. This type of adhesive also results in a reduction in deformation of elastic body 31 and piezoelectric body 32.

Because elastic body 31 and movable element base material 41 of the present embodiment have thin plate portions 31b and 41b, movable element 4 presses only slightly on stator 3, the thin material portion 31b deforms elastically and, when movable element sliding surface 42a and elastic body drive surface 31a are brought into contact, the clearance arising on the external diameter side of movable element sliding surface 42a disappears.

The pressure of movable element 4 against stator 3 and the impressed voltage or current for a given value of vibration amplitude value can be reduced since the restriction of the vibration of elastic body 31 can be reduced. Accordingly, the result is that the electric power consumption can be reduced.

An adhesive having a volume shrinkage of 3% or less is used in the above embodiments, but an embodiment could also use an adhesive having a volume shrinkage of 1% or less.

When an adhesive having a volume shrinkage of 1% or less is used, the height difference of the external diameter sides and internal diameter sides of drive surfaces 42a and 31a is observed to become less than 1 μm, with the further effects that the decrease in contact area of movable element sliding surfaces 22a and 42a and drive surfaces 11a and 31a of elastic bodies 11 and 31, respectively, can be reduced and, in addition, the decrease in drive efficiency can be reduced.

Adhesives of volume shrinkage of 1% or less include Debukon S-208 (Debukon Co.), which consists chiefly of an epoxy resin adhesive to which a polyamine resin is added as a setting agent, Debukon S-30 (Debukon Co.), an epoxy resin adhesive to which polyamide resin has been added. These types of adhesives provide suitable results in the present embodiment.

Without limitations to the embodiments described above, various modifications or alterations can be made, and are also included in the scope of the present invention. In previous embodiments, a large effect was obtained from the use of an adhesive having a volume shrinkage of 3% or less; however, for example, even with adhesives having rather small volume shrinkages (such as 4% or 5%), the convex distortion of the elastic body can be prevented and the reduction of the contact surface of the movable element sliding surface and the elastic body drive surface can be sufficiently prevented.

Moreover, in the afore-mentioned embodiments, the electromechanical conversion element has been described as a piezoelectric element; however, an electrostrictive element may also be used.

An ultrasonic motor according to the present invention and as illustrated in FIG. 1, includes a stator 1 having a piezoelectric body 12 (electromechanical conversion element) excited by a drive signal and, connected to this electromechanical conversion element, an elastic body 11 to give rise to a traveling vibration wave in a drive surface 11a by the excitation. A movable element 2 is driven by the traveling vibration wave and is in pressure contact with drive surface 11a. An adhesive layer 13 is disposed, using a low shrinkage adhesive agent, to join the piezoelectric body 12 and the elastic body 11.

In a preferred embodiment, the adhesive layer 13 is characterized in that, at the time of setting of the adhesive, its volume shrinkage is 3% or less.

Because the adhesive used for joining piezoelectric body 12 and elastic body 11 has a low shrinkage during setting, there is a reduction of the convex distortion of elastic body 11. Accordingly, there is an improvement in the reduction of the contact area of elastic body drive surface 11a and movable element sliding surface 22a, a sufficient starting torque is obtained, and an increase is brought about in the drive efficiency of the movable element.

By using an adhesive having a low volume shrinkage to join the elastic body and the piezoelectric body, the distortion of the stator at the time of setting can be reduced. In this manner, the reduction of the contact area of the elastic body drive surface and the movable element sliding surface can be prevented, the drive efficiency of an ultrasonic motor can be increased and, in addition, a sufficient starting torque can be obtained.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A vibration motor, comprising:

an electromechanical conversion element which is excitable by a drive signal;

an elastic body having a drive surface, the elastic body joined to the electromechanical conversion element for providing a vibration in the drive surface in response to excitation of the electromechanical conversion element by the drive signal;

a moving element in pressure contact with the drive surface of the elastic body and driven by vibration in the drive surface provided by the elastic body; and an adhesive layer joining the electromechanical conversion element and the elastic body, wherein the adhesive layer has at least one of the group consisting of (a) Vickers hardness of approximately Hv=8.0 or more, and (b) a longitudinal elastic modulus of approximately $E=180$ kgf/mm$^2$ or more.

2. A vibration motor as in claim 1, wherein the adhesive layer is an epoxy compound having a main agent.

3. A vibration motor as in claim 1, wherein the adhesive layer includes a main agent, the main agent being an anaerobic methacrylate type resin.

4. A vibration motor as in claim 2, wherein the epoxy compound is one of the group consisting of a one solution epoxy type and a two solution epoxy.

5. A vibration motor as in claim 4, wherein the adhesive layer includes a hardening agent, the hardening agent being an aliphatic polyamine.

6. A vibration motor as in claim 1, wherein the adhesive layer has a Vickers harness, Hv, within the range $8 \leq Hv \leq 24$.

7. A vibration motor as in claim 1, wherein the adhesive layer has longitudinal elastic modulus, E, within the range 180 kgf/mm$^2 \leq 300$ kgf/mm$^2$.

8. A vibration motor as in claim 1, wherein the elastic body has a resonance resistance of approximately 110 Ω or less.

9. A vibration motor, comprising:

an electromechanical conversion element which is excitable by a drive signal;

an elastic body having a drive surface, the elastic body joined to the electromechanical conversion element for providing a vibration in the drive surface in response to excitation of the electromechanical conversion element by the drive signal;

a moving element in pressure contact with the drive surface of the elastic body and driven by vibration in the drive surface provided by the elastic body; and an adhesive layer joining the electromechanical conversion element and the elastic body, wherein the adhesive layer includes an adhesive agent having a shrinking volume during setting of approximately three percent or less.

10. A vibration motor as in claim 9, wherein the adhesive layer includes a main agent and a hardening agent, the main agent being an epoxy compound and the hardening agent being a polyamine.

11. A vibration motor as in claim 9, wherein the adhesive layer includes a main agent and a hardening agent, the main agent being an epoxy compound and the hardening agent being a polyamide.

12. A vibration motor as in claim 9, wherein the adhesive layer includes a main agent, the main agent being a cyanoacrylate resin.

13. A vibration motor as in claim 9, wherein the elastic body has an annular form with a diameter of 50 mm or more.

* * * * *

UNITED STATES PATENT AND TRADEMARK OFFICE
CERTIFICATE OF CORRECTION

PATENT NO. : 5,654,604

DATED : August 5, 1997

INVENTOR(S) : Takatoshi ASHIZAWA, et al.

It is certified that error appears in the above-identified patent and that said Letters Patent is hereby corrected as shown below:

Col. 16, Claim 1,     line 7, before "Vickers" insert --a--.
Col. 16, Claim 4,     line 18, after "epoxy" insert --type--. (second occurrence)

Signed and Sealed this

Ninth Day of December, 1997

Attest:

BRUCE LEHMAN

Attesting Officer     Commissioner of Patents and Trademarks